United States Patent
Lin et al.

(10) Patent No.: US 9,061,887 B2
(45) Date of Patent: Jun. 23, 2015

(54) MOISTURE-RESISTANT PACKAGE

(75) Inventors: Chen Hua Lin, Douliu (TW); Roland van Gelder, Cupertino, CA (US)

(73) Assignee: Spatial Photonics, Inc., Sunnyvale, CA (US)

( * ) Notice: Subject to any disclaimer, the term of this patent is extended or adjusted under 35 U.S.C. 154(b) by 700 days.

(21) Appl. No.: 13/405,072

(22) Filed: Feb. 24, 2012

(65) Prior Publication Data

US 2013/0220874 A1    Aug. 29, 2013

(51) Int. Cl.
*G02B 1/00* (2006.01)
*B81B 7/00* (2006.01)

(52) U.S. Cl.
CPC ....... *B81B 7/0038* (2013.01); *B81C 2203/0109* (2013.01); *B81C 2203/019* (2013.01); *B81C 2203/032* (2013.01)

(58) Field of Classification Search
CPC .. B60R 1/0602; B60R 1/06; H01L 27/14618; H01L 2224/48247; H01L 2224/48227
USPC ......................................................... 359/507
See application file for complete search history.

(56) References Cited

U.S. PATENT DOCUMENTS

| | | | |
|---|---|---|---|
| 6,661,084 B1 * | 12/2003 | Peterson et al. | 257/680 |
| 7,538,932 B2 | 5/2009 | Pan | |
| 2010/0242600 A1 * | 9/2010 | Lin et al. | 73/504.12 |

* cited by examiner

*Primary Examiner* — Euncha Cherry
(74) *Attorney, Agent, or Firm* — Fish & Richardson P.C.

(57) ABSTRACT

Apparatus and method of making an improved moisture-resistant package for a MEMS device having movable parts, the package including a substrate, a translucent cover over the substrate, a seal and moisture barrier and a plurality of parallel sidewalls around the periphery of the substrate and cover. The sidewalls have ends and an area between the sidewalls, and the sidewalls separate the substrate and cover by a sufficient distance to provide clearance for the movement of the movable parts. The package is sealed using a glue layer that at least partially fills the area between the sidewalls, and lies between the ends of the sidewalls and one of the substrate or cover. The glue layer causes the substrate or cover, respectively, to adhere to the ends of the sidewalls. The glue layer and the sidewalls together prevent moisture from entering the package.

19 Claims, 8 Drawing Sheets

MOISTURE-RESISTANT PACKAGE

BACKGROUND

This specification relates to a package for a MEMS device. The disclosed embodiment is a package for a micromirror display device, often called a spatial light modulator, as is commonly used in projection displays. However, the package can be used for any MEMS device.

Micromirror projection display devices display an image by projecting light corresponding to the color channels of the image to be projected. A micromirror display device displays the pixels of the image by tilting mirror plates of micromirrors which, in one position, project light to the display (to display the pixel assigned to that mirror) and in the other position, deflect light away from the display (so as not to display the assigned pixel). It is important that the mirrors of micromirror devices tilt freely from one position to the other without any undesirable sticking at their end positions. To avoid sticking, the mirror packages usually contain an "antistiction" coating (usually referred to as "ASC") which prevents such sticking.

The array of mirror plates in a micromirror device is commonly built on top of a CMOS wafer which contains all the required electrical circuitry for operation of the mirrors. In order for the device to operate reliably, all the mirrors and related structures need to be protected from ambient conditions by placing the device into a sealed, hermetic or semi-hermetic package. Such a package consists of three functional parts: (1) the micromirror substrate that includes the CMOS circuitry and the mirrors; (2) a transparent top cover (typically glass) which allows the incoming light beam to reach the mirrors so the light can be reflected towards the collecting optics; and (3) a seal which connects the micromirror substrate to the glass cover. The combination of these three parts creates a closed cavity surrounding the micromirror device structure.

The seal typically consists of epoxy which, during application, is in a viscous state so that it can easily be applied. After mating of the substrate and transparent cover, the epoxy must be cured into a hard material that provides the necessary mechanical strength to keep the package closed and sealed.

Curing epoxy, for example, using UV light or heat, will often result in the removal of solvents from the epoxy. Chemical analysis of these solvents shows that they contain benzene ring elements which are known to reduce the effect of the ASC used to keep the mirrors from sticking in one or the other of their end positions.

Modern fabrication techniques do not make micromirror devices one at a time. Instead, a wafer containing hundreds or more of the devices is manufactured and packaged all at once. The packaging process consists of the steps of: (1) dispensing the primary epoxy seal either on the substrate or on the glass cover; (2) mating the substrate and the glass cover; (3) curing the epoxy; and (4) dicing the wafer of sealed packages into individual, sealed and packaged devices (called "singulation").

In order to maintain a defined tilt angle of the mirrors, it is desirable for a mirror to contact a landing post and be held against that post. When the mirror tilts over to the other side, the mirror will apply a substantial force to the landing post, which tends to displace the ASC on the post and to increase the adhesion of the mirror to the post. The displaced ASC needs to be replenished so as to recoat the surface of the landing post in order to minimize adhesion of the mirrors to the posts during the continuous operation of the mirrors. The ability to replenish the ASC depends, among other things, upon temperature, the presence or absence of moisture in the package and the quality of the ASC itself.

Therefore it is desirable to avoid ASC contamination. Such contamination can occur before and/or after introducing the ASC into the package. Experience has shown that epoxy outgassing of the package seal before the ASC is introduced can be a major source of ASC contamination. This contamination tends to increase the adhesion of the mirrors to the posts, both initially and later during reliability tests.

It is equally important not to allow moisture to get into the package. A high moisture level inside the package degrades device performance. Exposing the package to a combination of high temperature and humidity will cause moisture to get into the cavity containing the mirrors. A moisture-resistant seal is therefore required to avoid moisture from reaching the area of the package where the micromirror devices are.

One way of reducing moisture in the package is to reduce the seal thickness. As the seal material is the only material between the device substrate and the glass cover, the seal thickness must be thick enough, typically 10 um, to prevent the glass cover from ever touching the mirror surfaces at all angles to which the mirrors may be tilted during device operation. In addition, with less spacing between the substrate and the cover, defects in the glass surface will be closer to the mirror focal plane and hence more visible. Of course, as future devices become smaller, as they typically do, this minimum spacing will become smaller.

In order to reduce seal thickness to a more desirable thickness of less than 1 um, a spacer needs to be added on either the glass or the device side to prevent the mirrors from touching the glass cover and to render glass defects less visible. This spacer must be moisture-resistant. A highly moisture-resistant spacer can be achieved by bonding a third substrate to the glass cover, or by using Ni or Cu electroplating. But such solutions increase the number of process steps, complicating the manufacture of the devices and increasing their cost. As an alternative, a polymer resist material can be used to create a more cost effective physical structure, but these polymers have been found not to have the required moisture resistance required for micromirror devices.

One way the ASC can be applied to the packaged devices is through a hole in the seal, which afterwards must be closed, typically by using a plug. However, the moisture resistance around the plug tends to be less than that of the rest of the seal. Therefore creating a seal without using a plug is much more desirable. Furthermore, because plug-sealed devices must be individually tested after they sealed and diced, more manual handling is required, which can result in human error and is not well suited for mass production.

But creating a plugless seal requires that the ASC to be applied to the package before bonding of the two main parts, and the ASC, which is then present during sealing, must not be allowed to become degraded during the seal curing process. For example, creating a plugless seal using UV-curable epoxy in the presence of ASC beneath the seal material has been found to reduce the bonding strength of the seal.

Thermally cured epoxy results in acceptable seal bonding strength, even in the presence of ASC beneath the seal. However, the temperature required for curing thermal epoxy usually exceeds the ASC evaporation temperature, resulting in an undesirable loss of ASC during the sealing process.

SUMMARY

The improved moisture-resistant package for a MEMS device, as will be described in detail below, includes a substrate, such as a silicon substrate, on which are formed the electrical connections for the MEMS or micromirror devices, and the movable parts or movable micromirrors themselves. Micromirror devices are well known in the art and are described, for example, in U.S. Pat. No. 7,538,932 assigned to the same assignee as the subject invention. The package has a transparent, or at least, translucent cover over the substrate, and a seal and moisture barrier between the substrate and the cover.

The seal and moisture barrier includes a plurality of parallel sidewalls around the periphery of a substrate and cover, each of the sidewalls having ends and an area between the sidewalls. The sidewalls, preferably made from an organic material, such as photoresist, separate the substrate and cover by a sufficient distance to provide clearance for the movement of the movable parts. A glue layer at least partially fills the area between the sidewalls, and also between an end of the sidewalls and one of the substrate or cover. The glue layer causes the substrate or cover (whichever is attached to the ends of the sidewalls) to adhere to the end of the sidewalls.

Preferably, the sidewalls are coated with a moisture-resistant coating, or overcoat. This overcoat can be an inorganic material, such as aluminum oxide or zirconium oxide, or a combination of the two, preferably applied using an atomic layer deposition (ALD) process. This coating may also be a compound of silicon, for example, SiN, SiC or $SiO_x$. Depending upon the type of coating used, the coating may be applied using an ALD, CVD or PVD process. The glue layer may be epoxy which can be placed between the ends of the sidewalls and the substrate or cover, at least partially into the gaps between the sidewalls, and preferably filling these gaps. At least two sidewalls are used, preferably at least three.

The method of fabricating the improved moisture-resistant package described herein includes the steps of: (a) forming a plurality of parallel sidewalls around the periphery of a substrate or a translucent cover, the substrate having attached movable parts (the sidewalls have ends and an area between them, and they separate the substrate and cover by a sufficient distance to provide clearance for the movement of the movable parts); (b) applying a moisture-resistant coating on the sidewalls; (c) applying an antistiction coating between the substrate and the cover; (d) applying a glue layer to the ends of the sidewalls and at least partially to the area between the sidewalls, the glue layer being capable of adhering the ends of the sidewalls to the substrate or cover; and (e) sealing the sidewalls and substrate or cover together using the glue layer as a seal. Making the package by this method prevents moisture from entering the package.

BRIEF DESCRIPTION OF THE DRAWINGS

Like reference symbols in the various drawings indicate like elements.

DETAILED DESCRIPTION

Figure 1:
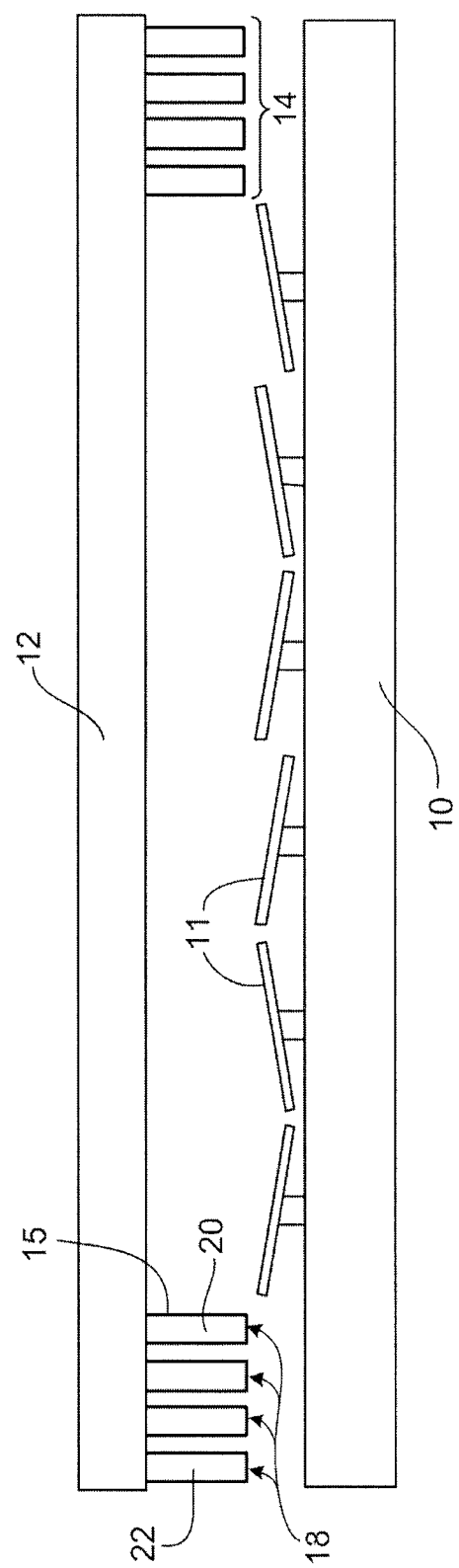
FIG. 1 is a cross-sectional view of a package of one embodiment of the invention before it has been sealed.

Referring to FIG. 1, one embodiment of the moisture-resistant package of the invention is shown. These packages are generally square or rectangular in shape. Tilting mirrors 11 are mounted on substrate 10, which may, for example be silicon. As shown, these mirrors 11 tilt to one side or the other depending upon the electrical signal applied to them, as is well known and described in the above-referenced U.S. Pat. No. 7,538,932. In order to protect the mirrors, they are sealed in the package by the attachment of a glass cover plate 12. This cover plate 12 is square or rectangular, conforming to the size of the package. A plurality of sidewalls 14 are placed between the cover plate 12 and substrate 10. In one embodiment, the plurality of sidewalls 14 are attached at the periphery of cover plate 12 by moisture-resistant seal 16. Alternatively, sidewalls 14 may be attached at the periphery of the substrate 10 instead of attaching them to the periphery of cover plate 12. In either case, the substrate 10 and cover plate 12 are later sealed. As FIG. 1 is a cross-section of the package, sidewalls 14 appear on opposites sides of the drawing, but in the actual package, they extend all around the square or rectangular periphery of the package.

After curing the epoxy seal, each panel on the wafer has to be physically separated into individual devices, a process called "singulation". As part of the singulation process, the glass needs to be cut, for example using a dicing saw, either completely through the glass or at least a fraction of way through the total glass thickness. Where the glass is not cut through completely, the remaining unbroken part of the glass is broken by hand. The resulting interface between devices may not be smooth, providing a potential source of glass particles. Even if the glass is cut completely through, if the distance between substrate 10 and glass cover 12 is too small, the CMOS wafer beneath the glass could be damaged by the saw during the cutting process, particularly near the bond pad area where the device is connected to the package. Preferably, sidewalls 14 are at least 50 um high so that the mirrors will not be adversely affected by glass particles during singulation. In that case, the glass may be cut through completely, yielding a smooth edge and eliminating the labor intensive breaking process.

Sidewalls 14 may be made from organic or inorganic material, for example, photoresist material, glass frit or a metal such as nickel or copper. A preferred embodiment of the invention employs photoresist material for sidewalls 14, for example TMMR S2000. This material can form sidewalls having a wide variety of thicknesses, for example, between about 5 and 700 um. In addition, this material enables forming sidewalls with high aspect ratios, for example, in excess of 20. The material has an excellent resistance to chemicals, allowing its use with many epoxy glue materials as well as other types of glue.

The photoresist has a high thermal resistance, enabling a high temperature sealing process to be used. As a specific example, a wall thickness of 130 um can be used. Using TMMR S2000 photoresist material for the sidewalls 14, an exposure dosage of 400 mj/cm2 can be used, with a post exposure bake of the photoresist at about 90° C. for about 10 minutes. The photoresist can be developed using a chemical solvent, such as PM Thinner, at about 23° C. for about 30 minutes.

Alternatively, the sidewalls 14 can be made using polymeric materials, such as epoxy-based or polyimide-based photosensitive materials, that may be formed using well known lithographic processes. The epoxy-based photosensitive material such as SU-8 and polyimide-based material, such as Toray's PW-series materials, may be used. In the alternative, screen printing techniques may be used with conventional UV/thermally cured epoxies, where the curing temperatures are sufficiently low to avoid damage to the devices.

To further improve the moisture resistance of the sidewalls 14, it has been found that a thin moisture-resistant coating, or overcoat 15 can be applied. This overcoat 15 is preferably as thin as necessary to achieve the desired amount of moisture resistance, as a thick overcoat takes longer to apply. It has been found that the effective overall moisture resistance of the sidewalls is improved even with a very thin overcoat.

Overcoat 15 may preferably be a transparent inorganic film which conformally overcoats sidewalls 14, but the overcoat is not limited to transparent materials. For example, the overcoat can be an inorganic material, such as oxides of aluminum or zirconium. Other materials suitable for ALD deposition may also be used. In addition, materials deposited by CVD may be used, such as SiN, SiC and/or $SiO_x$. Techniques for CVD deposition of these materials are well known in the art. However, as SiN and SiC are not transparent, care must be taken that these materials are not deposited in the active area of the mirrors, or if any material is accidentally deposited there, it must be removed. Alternatively, the overcoat 15 can be deposited using a PVD process known in the art, using materials such as $SiO_x$, indium tin oxide (ITO) or other similar materials that may be deposited using a PVD process.

A preferred overcoat layer 15 is aluminum oxide deposited by an ALD process. To deposit the aluminum oxide, trimethyl aluminum $(CH_3)_3Al$, known in the art as "TMA", and moisture $(H_2O)$ are deposited in sequence and adsorbed onto the surface of sidewalls 14. This deposition sequence is carried out repeatedly to form a layer of aluminum oxide. During each cycle of the process, excess TMA is purged, and then moisture is introduced to react with the adsorbed TMA to form the overcoat of aluminum oxide 15. Multiple aluminum oxide layers can be continuously formed on the surface of sidewalls 14 by repeating the process, thereby thickening the aluminum oxide to the thickness required to obtain the necessary moisture resistance. The preferred deposition temperature is less than 200° C., as higher temperatures may damage the sidewalls 14. It has been found that about five deposition cycles can be sufficient to obtain the desired amount of moisture resistance, but this can vary according to the materials used and the procedure used to deposit them. For example, 5 to 10 cycles of ALD can be used, or 100 to 200 cycles.

Furthermore, where multiple ALD sequences are used to deposit moisture-resistant layer 15, other materials capable of being deposited using ALD can be used, such as zirconium oxide. Alternatively, layer 15 may be formed using composite materials, for example, using alternating layers of aluminum oxide and zirconium oxide, thereby obtaining a composite $AlO_x/ZrO_x$ overcoat layer 15 on the sidewalls 14 to enhance its moisture resistance.

Next the ASC is applied to the device. Either before or after the epoxy material is applied, an ASC is deposited onto the substrate. This must be done before the package is sealed. The ASC can be applied by vapor phase deposition to the surface of the substrate 10, or to both the surface of the substrate 10 and the underside of glass cover 12. If desired, in addition to, or instead of vapor phase deposition of the ASC, ASC material may be deposited into the cavities of the device by getter absorption, by dosing with solution droplets, or by placing solid ASC material into the cavities, or a combination of some or all of these techniques.

Figure 2:
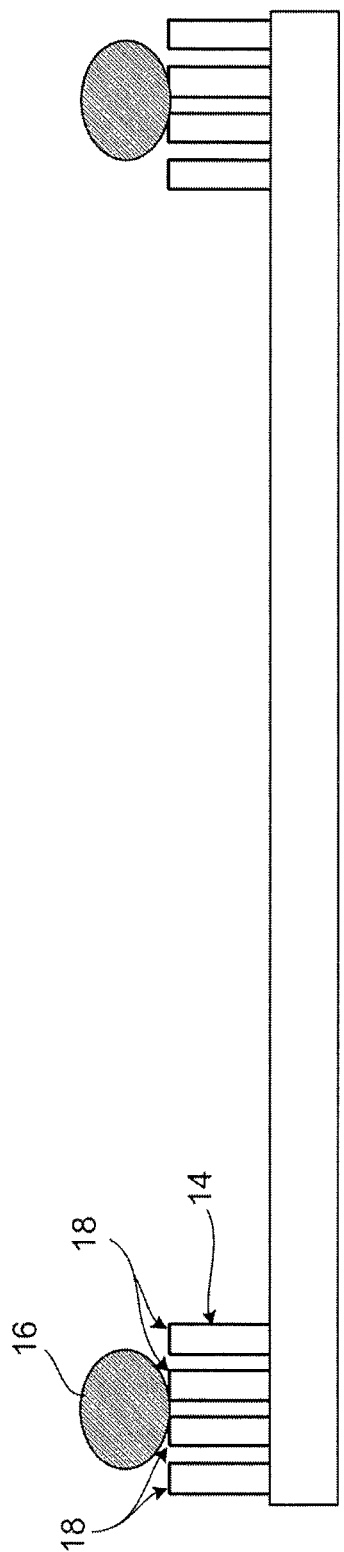
FIG. 2 is a cross-sectional view of the cover of a package of one embodiment of the invention showing the sidewalls and the initially applied sealing material.
Figure 3:
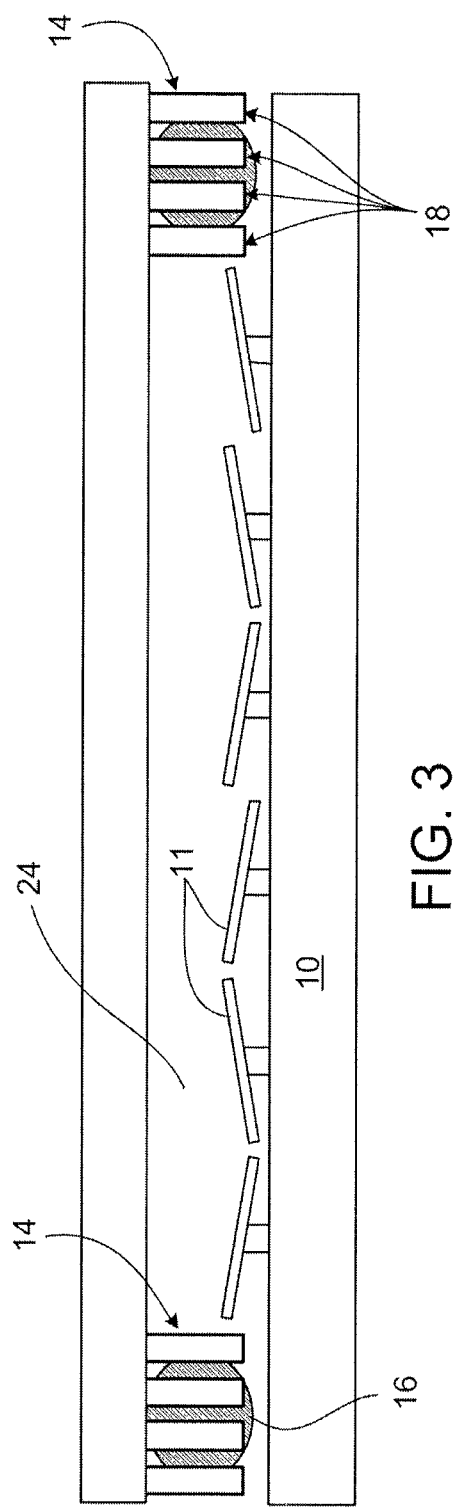
FIG. 3 is a cross-sectional view of the package of FIG. 1 after the sealing material has been applied within sidewalls.

Next, referring to FIG. 2, an epoxy seal material 16 is dispensed into the sidewalls 14. This epoxy seal material 16 will be used to form a bond between the glass cover 12 and substrate 10. The epoxy seal material is preferably dispensed onto the ends 18 of sidewalls 14 as shown in FIG. 2. By carefully selecting the dispensing conditions, such as the position of the epoxy dispenser relative to the substrate, and the amount of the sealant material dispensed and the rate of dispensing, the sealant can at least partially fill the gap between sidewalls 14, as shown in FIG. 3, but not spill over into the active area 24, thereby preventing undesirable gasses from the epoxy from entering the active device area 24 where mirrors 11 are located.

Figure 4:
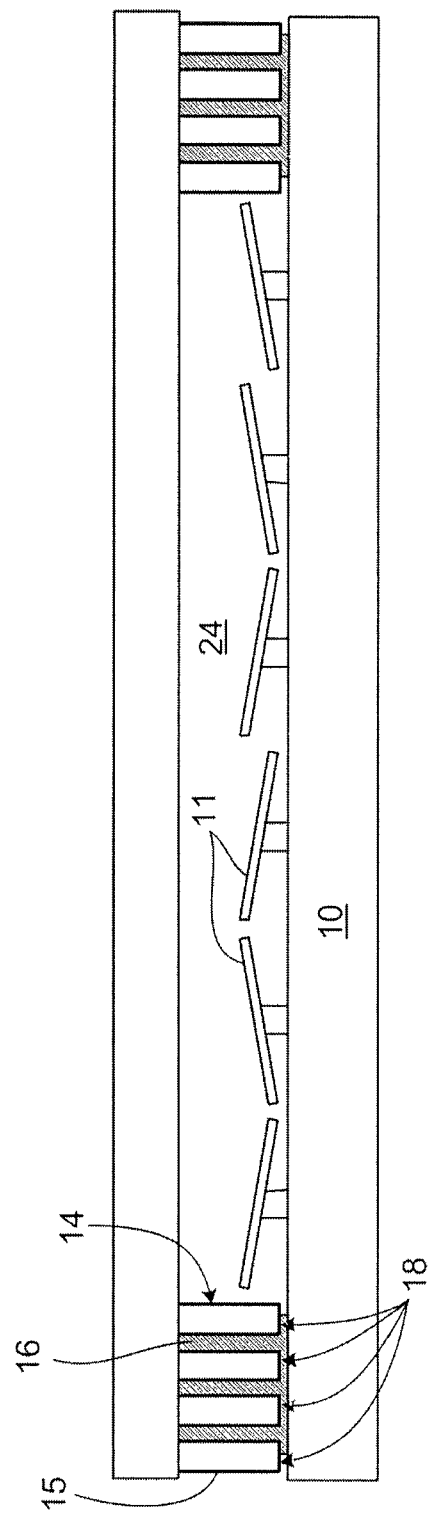
FIG. 4 is a cross-sectional view of a package of FIG. 1 after it has been sealed.

Next, the cover 12 and substrate 10 are pressed together, as shown in FIG. 4. The pressure applied in this step drives the epoxy material 16 to fill the space between the sidewalls 14. The ends 18 of sidewalls 14, which contact the substrate, can have a thin layer of epoxy on them, which will hold cover 12 and substrate 10 together once the epoxy is cured. It is preferable to have the epoxy 16 fill the entire space between the sidewalls 14, as shown in FIG. 4, to prevent any trapped, condensed moisture from entering the package. In addition, the epoxy protects the sidewalls 14 and prevents the inorganic coating 15 from peeling off. The sealant material between the ends 18 of sidewalls 14 and the surface of substrate 10, as shown in FIG. 4, is preferably as thin as possible, for example, less than 1 um.

During the cure process of the epoxy glue, solvents in the glue will outgas and may disperse towards the area of the moving mirrors. Therefore it is beneficial that there be as little direct exposure as possible of epoxy material 16 to the mirror devices. In this embodiment of the invention, as shown in FIG. 4, only the thin layer of epoxy between the ends 18 of sidewalls 14 and substrate 10 is directly exposed to the mirror devices. The epoxy 16 between the sidewalls 14 will be prevented by the sidewalls from entering the area 24 inside sidewalls where the mirrors 11 are located.

Figure 5:
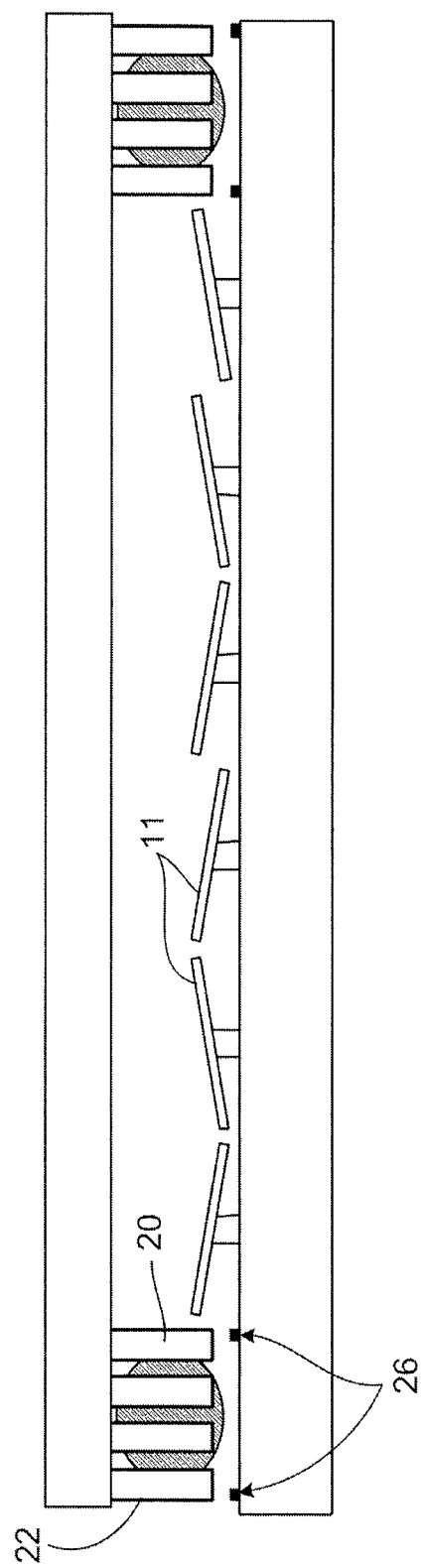
FIG. 5 is a cross-sectional view of a package of another embodiment of the invention before it has been sealed.
Figure 6:
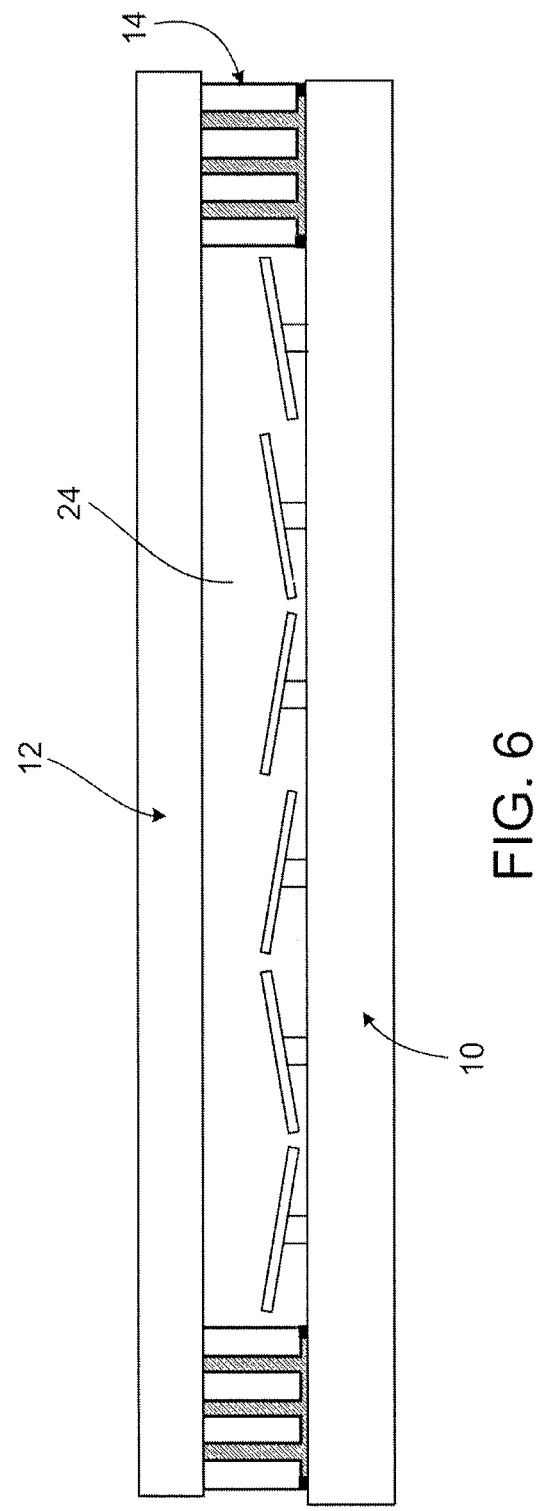
FIG. 6 is a cross-sectional view of a package of FIG. 5 after it has been sealed.

In the embodiment of the invention shown in FIGS. 5 and 6, mechanical barriers 26 are placed on substrate 10 in the area where the inner sidewall 20 and outer sidewall 22 will contact the substrate 10 during the sealing process. If the sidewalls are to be bonded to the glass cover 12 instead of to the substrate 10, these mechanical barriers will be formed on the glass cover 12 instead of on the substrate 10. These barriers are placed on the substrate 10 prior to attaching substrate 10 to cover 12 to prevent the gasses from the epoxy material from reaching the area where the mirrors 11 are located. The seal under the outer sidewall 22 is to prevent these gasses from reaching neighboring devices on the same wafer. FIG. 6 shows the package after sealing.

Figure 7:
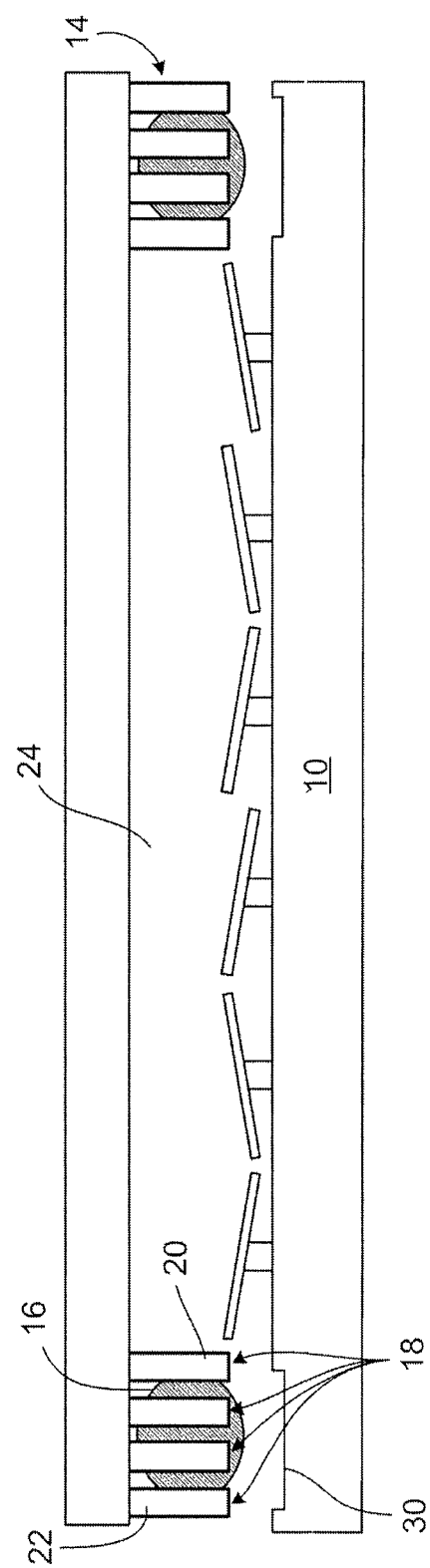
FIG. 7 is a cross-sectional view of a package of yet another embodiment of the invention before it has been sealed.
Figure 8:
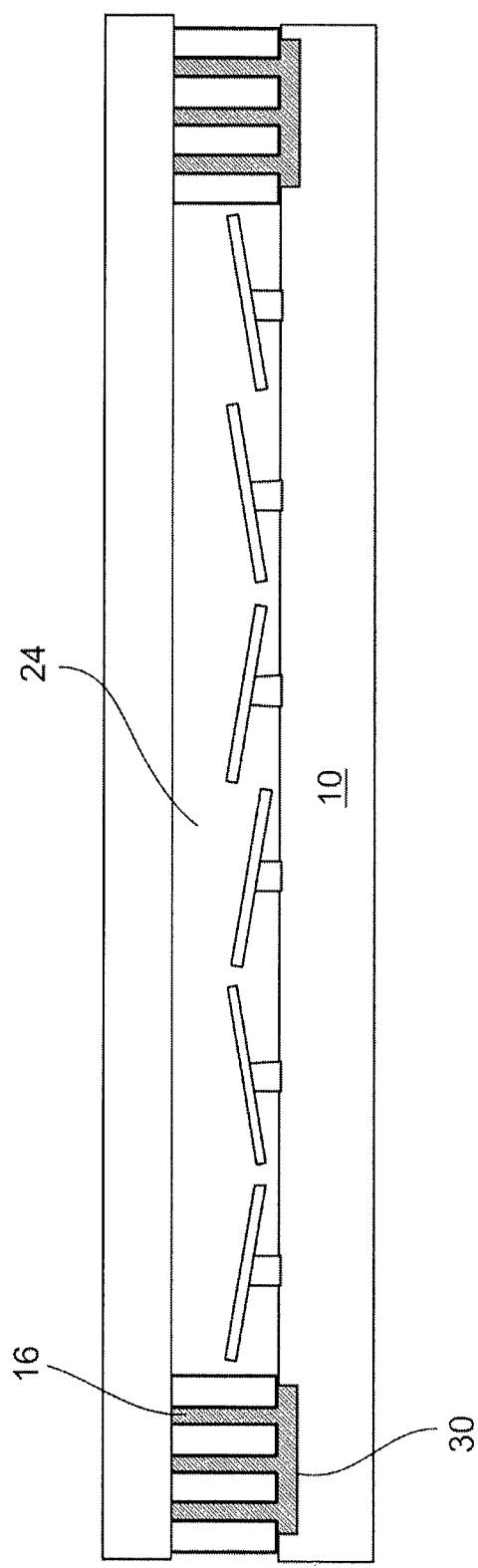
FIG. 8 is a cross-sectional view of a package of FIG. 7 after it has been sealed.

In the embodiment of the invention shown in FIGS. 7 and 8, instead of barrier 26, shown in FIGS. 5 and 6, a recess or cavity 30 is formed in substrate 10 in the area between the places where outer sidewall 22 and inner sidewall 20 will contact the substrate 10 during the sealing process. FIG. 8 shows the package after sealing.

Recess 30 can have, for example, a depth equal to the desired thickness of the epoxy glue layer between the ends 18 of sidewalls 14 and substrate 10, for example, less than about 1 um. These cavities prevent the gasses from the epoxy material 16 from reaching the area 24 where the mirrors are located and from reaching neighboring devices on the same wafer.

The advantages of the package described in various embodiments include that it is moisture-resistant, it provides a sealed cavity which contains the ASC, it can be sealed under atmospheric conditions and it does not require a plug. The described package is readily manufacturable and achieves a moisture barrier, preferably by using composite materials. In addition, the package has a large gap between translucent cover and micromirrors that provides wider process tolerances and has greater tolerance of defects.

The process of manufacturing the package of the invention has fewer process steps and is capable of high throughput manufacture with far less manual handling than, for example, is required with processes using plugs. Furthermore, the described process prevents harmful materials from the epoxy from outgassing during the sealing process and entering the area containing the micromirrors where it can cause damage.

What is claimed is:

1. An improved moisture-resistant package for a MEMS device having movable parts, comprising:
    a substrate;
    a translucent cover over the substrate;
    a seal and moisture barrier, comprising:
        a plurality of parallel vertical sidewalls, each extending around the periphery of the substrate and cover, the plurality of the vertical sidewalls having ends and an area between each of the plurality of vertical sidewalls, the vertical sidewalls separating the substrate and cover by a sufficient distance to provide clearance for the movement of the movable parts; and
        a glue layer covering the ends of the vertical sidewalls and substantially filling the area between the plurality of vertical sidewalls and between the ends of the vertical sidewalls and one of the substrate or cover, the glue layer causing the substrate or cover, respectively, to adhere to the ends of the sidewalls, the glue layer and the vertical sidewalls together preventing moisture from entering the package.

2. The improved moisture-resistant package of claim 1 wherein the sidewalls are made of an organic, non-conductive material.

3. The improved moisture-resistant package of claim 2 wherein the organic material is photoresist.

4. The improved moisture-resistant package of claim 1, further comprising a moisture-resistant coating over the sidewalls.

5. The improved moisture-resistant package of claim 4 wherein the moisture-resistant coating is an inorganic material or a compound of silicon.

6. The improved moisture-resistant package of claim 4 wherein the moisture-resistant coating is aluminum oxide.

7. The improved moisture-resistant package of claim 4 wherein the moisture-resistant coating is aluminum oxide and zirconium oxide.

8. The improved moisture-resistant package of claim 1 wherein the glue layer is epoxy.

9. The method of fabricating an improved moisture-resistant package comprising the steps of:

a. forming a plurality of parallel, vertical sidewalls around the periphery of a substrate or a translucent cover, the substrate having movable parts attached thereto, the plurality of the vertical sidewalls having ends and an area between the plurality of vertical sidewalls, the vertical sidewalls separating the substrate and cover by a sufficient distance to provide clearance for the movement of the movable parts;
    b. applying a moisture-resistant coating on the sidewalls; and
    c. applying a glue layer to the ends of the sidewalls, the glue layer substantially filling the area between the sidewalls, the glue layer capable of adhering the ends of the sidewalls to the substrate or cover; and
    d. sealing the sidewalls and substrate or cover together using the glue layer as a seal, thereby preventing moisture from entering the package.

10. The method of fabricating an improved moisture-resistant package of claim 9 wherein the sidewalls are made of a non-conductive organic material.

11. The method of making an improved moisture-resistant package of claim 10 wherein the organic material is photoresist.

12. The method of fabricating an improved moisture-resistant package of claim 9 wherein the moisture-resistant coating is aluminum oxide.

13. The method of fabricating an improved moisture-resistant package of claim 12 wherein the aluminum oxide is applied using an ALD process.

14. The method of fabricating an improved moisture-resistant package of claim 12 wherein the aluminum oxide is formed by repeated alternating depositions of trimethyl aluminum and moisture.

15. The method of fabricating an improved moisture-resistant package of claim 9 wherein the moisture-resistant coating is a compound of silicon applied using a CVD process.

16. The method of fabricating an improved moisture-resistant package of claim 9 wherein the moisture-resistant coating is a $SiO_x$ or ITO deposited using a PVD process.

17. The method of fabricating an improved moisture-resistant package of claim 9 wherein a first glue layer is formed around the periphery of a substrate and the glue layer applied to the ends of the vertical sidewalls contacts the first glue layer during the sealing step.

18. The method of fabricating an improved moisture-resistant package of claim 9 wherein the substrate has a recess around its periphery and the sidewalls are sealed to the substrate at least partially within the recess.

19. The method of fabricating an improved moisture-resistant package of claim 9 wherein an antistiction coating is applied between the substrate and cover prior to the sealing step.

* * * * *